(12) United States Patent
Bray (10) Patent No.: US 8,155,348 B2
(45) Date of Patent: Apr. 10, 2012

(54) POST PHASE-INVERTER VOLUME CONTROL

(76) Inventor: David William Bray, Sundance, WY (US)

( * ) Notice: Subject to any disclaimer, the term of this patent is extended or adjusted under 35 U.S.C. 154(b) by 862 days.

(21) Appl. No.: 12/286,694

(22) Filed: Sep. 30, 2008

(65) Prior Publication Data

US 2010/0080403 A1    Apr. 1, 2010

(51) Int. Cl.
*H03G 3/00*    (2006.01)

(52) U.S. Cl. ........ 381/104; 381/105; 381/106; 381/107; 330/145; 330/84; 330/690; 704/500

(58) Field of Classification Search .................. None
See application file for complete search history.

(56) References Cited

U.S. PATENT DOCUMENTS

| | | |
|---|---|---|
| 4,636,740 A | 1/1987 | Kager |
| 4,644,289 A | 2/1987 | Kennedy et al. |
| 4,864,245 A | 9/1989 | Kasha |
| 5,546,046 A | 8/1996 | Trentino |
| 5,550,508 A | 8/1996 | Trentino |
| 5,550,509 A | 8/1996 | Trentino |
| 6,111,961 A | 8/2000 | Hedrick et al. |
| 7,053,714 B1 | 5/2006 | Fields et al. |
| 2006/0012424 A1 | 1/2006 | Peavey et al. |

*Primary Examiner* — Fernando L Toledo
*Assistant Examiner* — Mark A Laurenzi
(74) *Attorney, Agent, or Firm* — TraskBritt (57) ABSTRACT

A post phase-inverter master volume regulator for use in combination with a tube-type musical amplifier having a phase-inverter tube. The signals at both sides of the phase-inverter tube's DC voltage plate are extracted from the amplifier for processing by the master volume regulator. In one embodiment, such signals are extracted by inserting a male/female tube base between the amplifier's phase-inverter tube and its socket. The two voltage plate signals are then transmitted through a multiconductor umbilical to an exterior enclosure. Each signal is connected to ground through its respective user adjustable rheostat, permitting the user to simultaneously change the inverter-tube's two voltage signals (and vary the amplifier's volume). The regulator may also include circuitry adapted to provide a bass-boost, and/or a high frequency cutoff. Sometimes, first and second volume controls may be provided to permit a user to quickly change between two volume settings. In another embodiment, a dual-ganged pot, for controlling the volume, would be mounted directly in the tube base, thereby eliminating the need for an umbilical and an exterior enclosure.

26 Claims, 7 Drawing Sheets

POST PHASE-INVERTER VOLUME CONTROL

FIELD OF THE INVENTION

The instant invention relates to electronic amplification systems for musical instruments, and more particularly to signal processing circuitry for use in combination with tube-type musical amplifiers.

BACKGROUND

It is known in the art to employ amplification systems to modify the signal generated by a musical instrument, e.g., a guitar, for playback of such modified signal through a loud speaker. Various types of amplification systems are commercially available, including amplifiers based upon solid-state components, and amplifiers based upon vacuum tube components. The latter type of amplifier will be made reference to in this disclosure as a "tube-type" amplifier.

The sound quality of a musical instrument is known to be effected by the type of amplification system used in playback of the instrument through a speaker system. Certain performers prefer the sound quality that may be delivered by tube-type amplifiers. The perceived sound quality typically includes a certain amount of inherent distortion and a range of modifications that may be made to an instrument's generated musical signal by certain signal-manipulating circuitry.

Certain known amplification systems and related circuitry, which are relevant to the instant invention, are disclosed in U.S. Pat. Nos. 7,053,714; 6,111,961; 5,550,509; 5,550,508; 5,546,046; 4,864,245; 4,644,289; and 4,636,740. A distortion-inducing circuit for application in an amplifier system is disclosed in Unites States Patent Application Serial No. 2006/0012424. The entire disclosures of the aforementioned publications are hereby incorporated as though set forth herein in full for their teachings of amplification systems and related circuitry.

It would be an advance in the art to provide a tube-type musical amplifier capable of producing a musical signal for playback through a speaker system at a plurality of volume levels, but which produces a sound at each such volume level that is much closer to the sound of the amplifier "on ten," or at its maximum volume setting.

BRIEF SUMMARY OF THE INVENTION

A post phase-inverter master volume control for use in combination with a tube-type musical amplifier having a phase-inverter tube disposed inside a main enclosure. In a preferred embodiment, the master volume control circuitry includes a first lead connected at its first end to the signal at a first side of the phase-inverter tube's DC plate voltage supply. Similarly, a second lead is connected at its first end to the signal at a second side of the phase-inverter tube's DC plate voltage supply. The post phase-inverter master volume control may be disposed either within the main enclosure or alternatively, within a remote enclosure. When portions of the master volume control circuitry are disposed inside a remote enclosure, a third lead is desirably connected at its first end with an amplifier ground to provide a common ground for the amplifier and master volume control circuit. In such case, the first, second, and third leads form an umbilical between the amplifier and the remote enclosure. In any case, the master volume control includes a first variable resistor, such as a rheostat, connected in-circuit between ground and the first lead, and a second variable resistor, such as a rheostat, connected in-circuit between ground and the second lead. Typically, both rheostats of a volume control are ganged together to provide similar resistance changes responsive to user input.

The DC plate voltage supply signals for the phase-inverter tube can conveniently be extracted from the amplifier by using a male/female tube base disposed between a circuit board of the amplifier and the phase-inverter tube. In such case, the phase-inverter tube is removed, the tube base is installed in the newly empty socket, and the phase-inverter tube is installed into the tube base. An operable tube base includes a 9-pin male/female tube base. The tube base provides the first lead and second leads, and can also include certain additional electrical components, such as DC blocking capacitors.

An external remote enclosure may be provided in which to hold the first and second rheostat, as well as selected portions of the master volume control circuitry. When an external enclosure is used, it is generally desirable to include DC blocking capacitors disposed to resist conductance of excessive DC voltages through the first and second leads to the exterior enclosure. It is anticipated that voltages in the range of 250-450 VDC will be encountered. Placement of blocking resistors inside the tube base prevents the DC voltage from traveling through the cable, into the remote enclosure. Although in some embodiments the DC voltage blocking caps may be located inside of the remote enclosure, in preferred constructions the blocking caps would be located inside the tube base. The preferred construction provides additional security should something happen such as the enclosure being knocked off of the amp, and the cable being damaged. The DC blocking caps must exist and be positioned in the circuit at some location to ensure the proper operation of the unit. In the absence of the blocking caps the plate voltage feeding the PI tube would go to ground. In preferred constructions a cap size of at least 1.2 µF is used. Caps of larger size are also anticipated, in order to make the volume on the amp quieter on the unit's quietest setting, as there were still some low frequencies present with the lower value cap. Cap sizes of 1.5 or 2.0 µF are within contemplation.

Sometimes, the master volume control circuitry includes a range switching circuit. One range switching circuit within contemplation includes an on/off switch placed in electrical series with a resistor and disposed in-circuit between the first and second leads. It has been determined that one operable resistor for such a circuit has a resistance in excess of about 100 k ohms. Resistors smaller than 100 k ohms are also within contemplation. In an alternative embodiment a DPDT switch, which would place a resistor of approximately 27 k ohms in parallel with each 250 k variable resistor, being used to reduce volume in the remote box. In a preferred embodiment of the invention, the circuit for the low-pass filter is a 250 k reverse audio pot, connected in series with a 0.0047 µF cap, between the two sides of the PI leads. An ON/OFF switch is used to disconnect the circuit completely, as there is still some high-end loss, even with the pot on its lowest setting.

Sometimes, the master volume control circuitry also includes a low-pass filter circuit disposed in-circuit between the first and second leads. One operable such low-pass filter circuit (or high-cut circuit) includes a capacitor in series with a resistor. Desirably, the low-pass filter circuit is capable of adjustment by a user to change a value of the high-cut signal. Such adjustability may be provided by constructing a low-pass filter circuit with a variable resistor and a capacitor connected in series between the first and second leads. An operable variable resistor for use in such circuit includes a potentiometer having a 250 k ohm rating. An operable capacitor for use in such circuit has a rating of about 0.0047 micro Farads. In an alternative arrangement, the low-pass filter circuit (or high-cut circuit) includes a multi-position switch that is user operable to dispose a selected capacitor in-circuit between the first lead and the second lead. One workable embodiment permits user selection of a capacitor having a rating of any of about 50 pF, 350 pF, 750 pF, 1550 pF, or 3150 pF.

Certain embodiments of volume control circuitry may include a bass-boost circuit. One operable bass-boost circuit includes a first capacitor disposed in series between the first side of the phase-inverter tube and the second end of the first lead. A second capacitor is similarly disposed in series between the second side of the phase-inverter tube and the second end of the second lead. Operable capacitors for a bass-boost circuit generally have a rating of less than about 0.05 µF. The bass-boost circuit can be placed into service, or removed from service, by an on/off switch. One operable such switch includes first and second switch elements disposed in parallel with, and operable to bypass, the respective first and second capacitors. When such switch is open, the signals carried by the first and second leads are attenuated by the respective first and second capacitors. When such switch is closed, the signals can effectively bypass the capacitors through the electrically conductive respective switch elements. In an alternative construction the bass boost may be rendered variable by the use of a 5 k dual-ganged pot as a rheostat. Use of the pot adds 5 k of resistance in series to the signal, causing it to travel through the 0.047 µF resistors thereby causing the unit to attenuate only high and mid frequencies.

Certain embodiments of master volume control circuitry may include both of a master volume control and a second volume control. A second volume control may include a third rheostat connected in-circuit between the first lead and ground, and a fourth rheostat connected in-circuit between the second lead and ground. Again, the third and fourth rheostats are desirably ganged together to provide similar resistance changes responsive to user input.

Typically, a volume selector switch is arranged to enable user selective operation of either one of the master volume control or the second volume control. One currently preferred volume selector switch includes a foot-operated switch. Such foot-operated switch can be placed in-circuit to energize one or more relay device effective to permit user selectable electrical communication between either of: the first and second rheostat and the musical amplifier, or the third and fourth rheostat and the musical amplifier. When a remote volume selector switch is included, sometimes it is desirable to provide one or more light-emitting elements disposed in-circuit and effective to indicate which volume control is currently active.

BRIEF DESCRIPTION OF THE DRAWINGS

In the drawings, which illustrate what are currently considered to be the best modes for carrying out the invention.

DETAILED DESCRIPTION OF THE INVENTION

Figure 1:
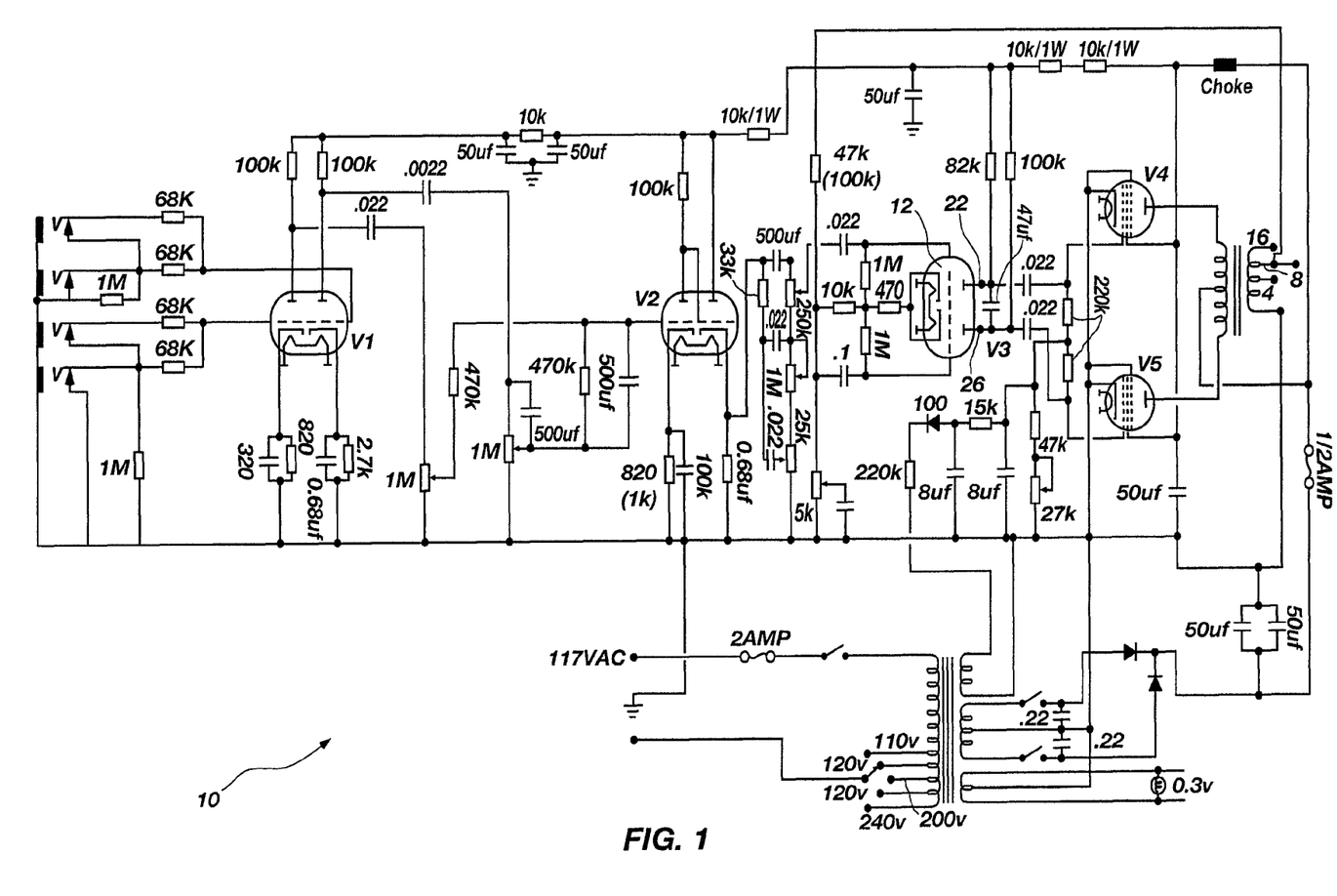
FIG. 1 is an electrical schematic for a representative tube-type amplifier to which embodiments of the invention may be added.
Figure 2:
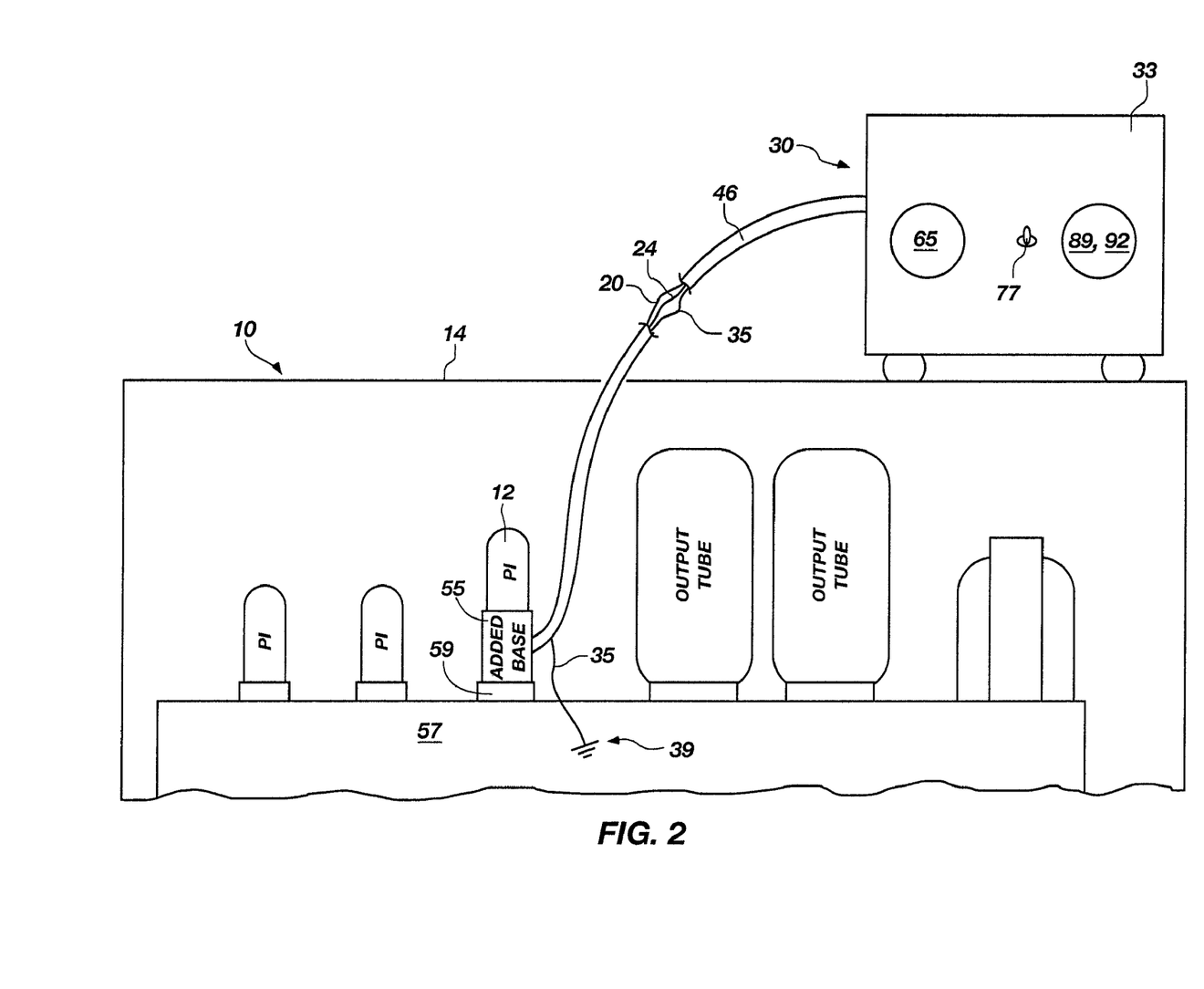
FIG. 2 is a pictorial view in elevation of a first embodiment structured according to certain principles of the invention.

With reference to FIGS. 1 and 2, the invention may be embodied as a post phase-inverter master volume control for use in combination with a tube-type musical amplifier, generally 10, having a phase-inverter ("PI") tube 12 disposed inside a main enclosure 14. The master volume control circuitry includes a first lead 20 connected at its first end to the signal at a first side 22 of the phase-inverter tube's DC plate voltage supply. Similarly, a second lead 24 is connected at its first end to the signal at a second side 26 of the phase-inverter tube's DC plate voltage supply.

A first currently preferred embodiment of a master volume control structured according to certain principles of the instant invention is indicated generally at 30 in FIG. 2. Portions of the master volume control circuitry for volume control 30 may be conveniently disposed in a remote enclosure 33. When using a remote enclosure 33, a third lead 35 is desirably connected at its first end with an amplifier ground, generally 39, to provide a common ground for the amplifier 10 and certain components of the master volume control 30. Connections between electrical components of any circuitry portion included in preferred embodiments are typically made using conventional manufacturing techniques, including soldering, male/female plug fit components, clips such as alligator clips, magnets including rare earth magnets, and compression (e.g., under influence of a fastener, such as entrapment by a screw, or by crimping a malleable material, such as a metal sleeve).

As illustrated, the first lead 20, second lead 24, and third lead 35 are included in an umbilical 46 stretching between the amplifier 10 and the remote enclosure 33. Of course, in an alternative configuration within contemplation, it is to be realized that a master volume control structured according to certain principles of the instant invention could simply be housed in the main enclosure 14.

Figure 3:
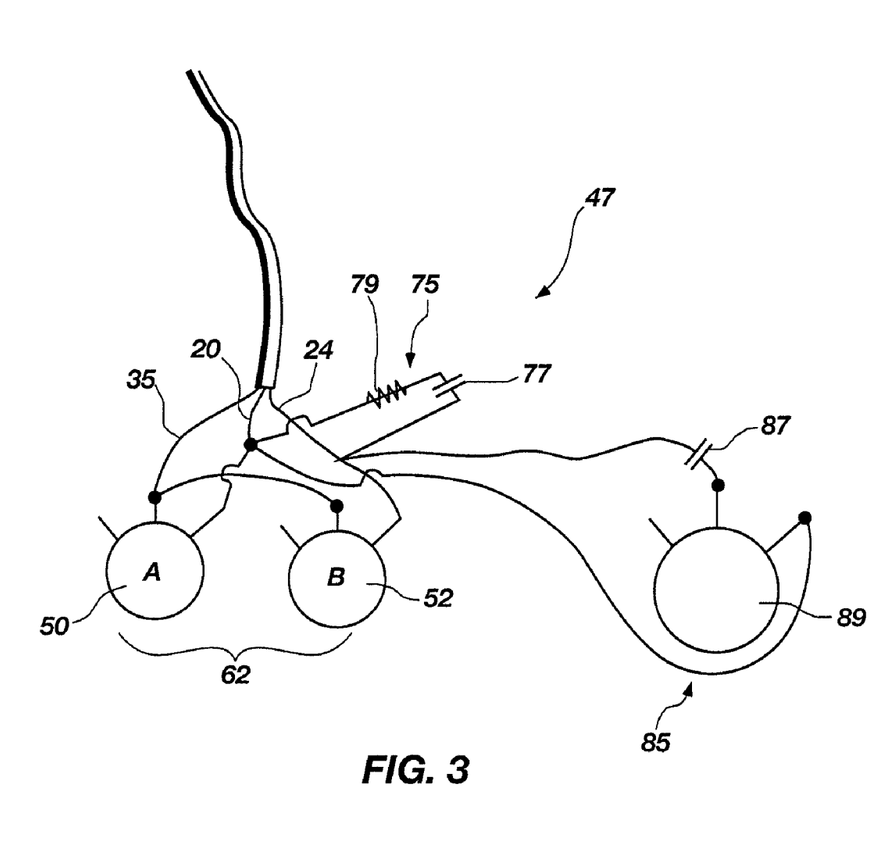
FIG. 3 is an electrical schematic of a portion of first operable volume control circuitry.

With reference to FIG. 3, a portion of first operable master volume control circuitry, generally indicated at 47, includes a first variable resistor, such as first rheostat 50, connected in-circuit between ground 35 and the first lead 20, and a second variable resistor, such as second rheostat 52, connected in-circuit between ground 35 and the second lead 24. It has been determined that an operable rheostat may be formed from a portion of a multi-ganged potentiometer, such as a 100 k ohm, 250 k ohm or 500 k ohm dual-ganged potentiometer. An exemplary such potentiometer is commercially available under Part #313-2420F-250k from Mouser Electronics of Mansfield, Tex. at http://www.mouser.com.

It should be noted that the terms "rheostat" and "potentiometer" may be used interchangeably for purpose of this disclosure. Such terms are intended to generally encompass all operable resistors having a user-adjustable resistance. Potentiometers symbolically illustrated in certain of the drawing figures are typically wired in-circuit to function as rheostats. Decreasing the resistance provided by the paired rheostats 50, 52, illustrated in FIG. 3 reduces the voltage across the phase-inverter tube 12, and consequently decreases the volume output of the amplifier 10. Therefore, the amplifier 10 may be set "on 10" (or at any other desired volume level), and the master volume control may be used to adjust a volume of a playback signal.

As a convenience, both rheostats of a volume control switch 62 are desirably ganged together to provide similar resistance changes responsive to a given user input. Adjustment of the volume control switch 62 may then be made simply by adjusting a single control interface, such as volume control knob 65 as shown in FIG. 2. It is within contemplation for a user to be able to make an equivalent resistance adjustment by operation of some other known control interface, such as a slide-bar, joy stick, or any other interface that is user operable to effect a change in resistance.

With reference once again to FIG. 2, the DC plate voltage supply signals for the phase-inverter tube 12 can conveniently be extracted from the amplifier 10 by disposing a male/female tube base 55 between a circuit board 57 of the amplifier and the phase-inverter tube 12. In such case, the phase-inverter tube 12 may simply be removed, the tube base 55 is then installed in the newly empty socket 59, and the phase-inverter tube 12 is installed into the tube base 55. Therefore, in accordance with certain principles of the instant invention, the original signal path from the phase-inverter tube to the output tubes of the amplifier (e.g., amplifier 10) remains unbroken. An operable tube base 55 includes a 9-pin male/female tube base, such as is commercially available from the Dongzin Company of China under part number # TS-9 from http://www.tubesocket.cn/Product.asp?BigClassName=%BE%C5%BD%C5(9-pin).

The tube base 55 provides a convenient connection for first ends of the first lead 20 and second lead 24, and can also house certain additional electrical components, such as DC blocking capacitors.

In currently preferred embodiments, an external enclosure 33 is provided in which to hold the first and second rheostat 50, 52, as well as other selected portions of the master volume control circuitry. When an external enclosure 33 is used, it is generally desirable to include DC blocking capacitors disposed to resist conductance of excessive DC voltages through the first and second leads to the exterior enclosure. By "excessive," it is meant that the voltages, for which transmission is desired to be resisted, e.g. voltages having the potential to cause injury, pain, or harm to a person.

Figure 4:
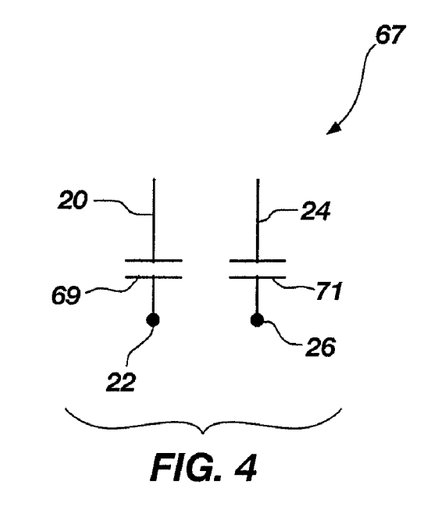
FIG. 4 is an electrical schematic illustrating certain optional DC voltage blocking circuitry.

One effective DC blocking circuit portion, generally indicated at 67, is illustrated in FIG. 4. Circuit portion 67 includes a blocking capacitor 69 in series between the signal at the first side 22 of the phase-inverter tube 12 and a second end of first lead 20. Also included in circuit portion 67 is blocking capacitor 71 in series between the signal at the second side 26 of the phase-inverter tube 12 and a second end of second lead 24. A currently preferred blocking capacitor has a capacitance of about at least 1.2 µF in value and rated for about 600 volts. The voltage on the plates of the PI tube can be as high as 450 volts DC. It is therefore preferable that the caps are located in the tube base, rather than the remote box, in case the connecting cord becomes damaged, IMO. In an alternative embodiment the DC caps could be located inside the remote box, if a sturdy-enough connecting cable is used, although this particular embodiment is not preferred. The invention preferably provides for DC blocking caps in the PI tube base, so that the signal can be safely manipulated with a remote enclosure or control.

Sometimes, the master volume control circuitry can optionally include a range switching circuit. One range switching circuit within contemplation is indicated generally at 75 in FIG. 3. Range switching circuit 75 includes an on/off switch 77 placed in electrical series with a resistor 79 and disposed in-circuit between the first and second leads 20 and 24, respectively. It has been determined that one operable resistor 79 for such circuit has a resistance in excess of about 100 k ohms. It is anticipated that this resistance will be less than 100 k and possibly as low as 47 k or 33 k. Alternatively, the range circuit could be configured to use a DPDT switch that would position a resistor (approximately 27 k, more or less) in parallel with each volume pot, see reference numerals 50 and 52 in FIG. 3. The resistor 79 operates, when placed into electrical communication, to drop the voltage across the phase-inverter tube 12 and thereby reduce a volume output from amplifier 10.

Sometimes, the master volume control circuitry 47 may optionally include a low-pass filter circuit disposed in-circuit between the first lead 20 and second lead 24. One operable such low-pass filter circuit (or high-cut circuit) is indicated generally at 85 in FIG. 3. Low-pass filter 85 includes a capacitor 87 disposed in series with a resistor 89. Desirably, the low-pass filter circuit 85 is capable of adjustment by a user to change a value of the high-cut signal. Such adjustability may be provided by constructing a low-pass filter circuit 85 with a variable resistor 89 and a fixed capacitor 87 connected in series between the first and second leads. An operable variable resistor for use in such circuit includes a potentiometer having a 250 k ohm rating. An operable capacitor for use in such circuit has a rating of about 0.0047 micro Farads. It is anticipated to provide an "ON/OFF" switch at this location for disconnecting the circuit completely. This provision is anticipated in view of a slight bit of high-end roll-off on the lowest setting which was encountered.

Figure 5:
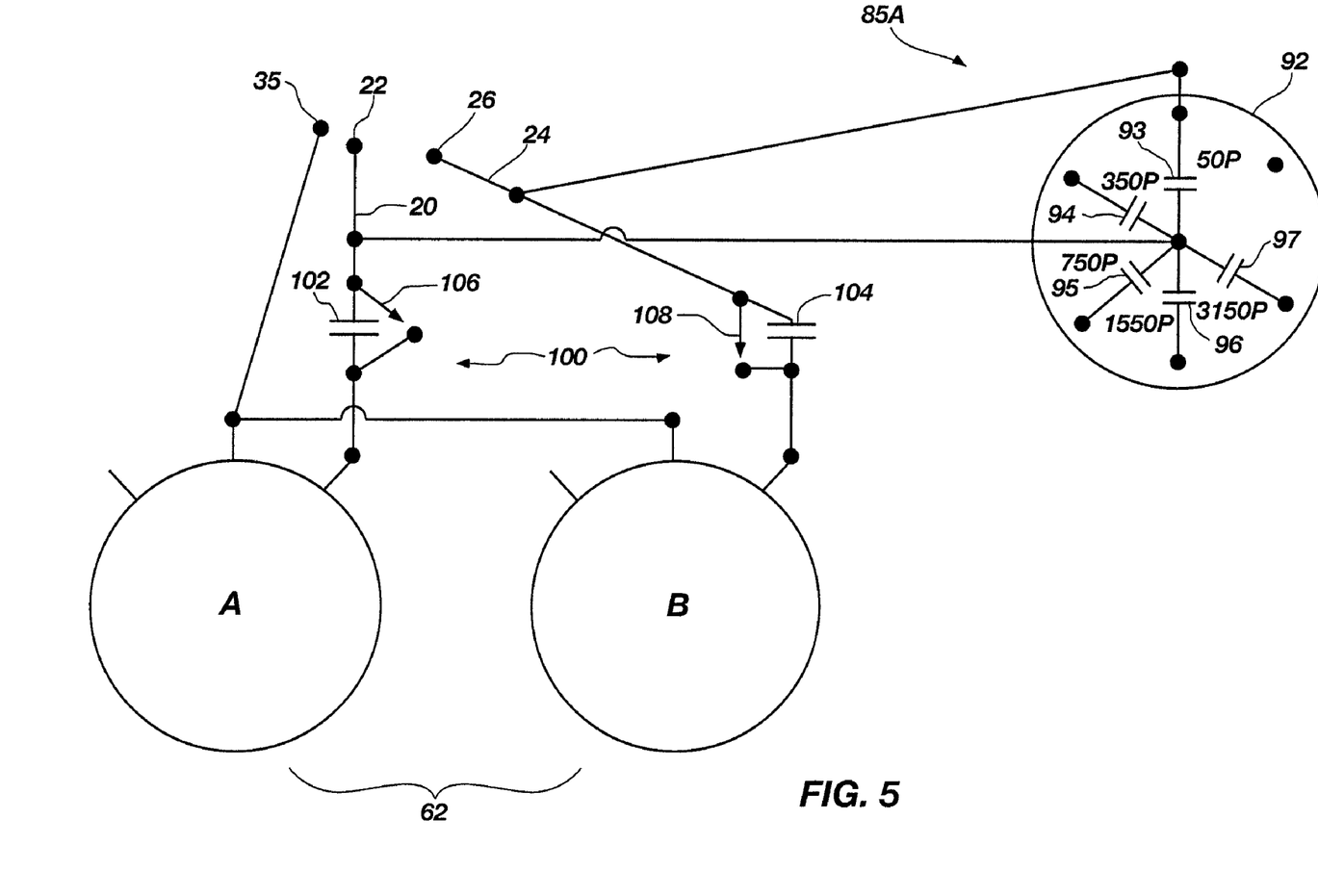
FIG. 5 is an electrical schematic of a portion of second operable volume control circuitry.

In an alternative arrangement (see FIG. 5), an operable low-pass filter circuit 85A (or high-cut circuit) includes a multi-position switch 92 that is user operable to dispose a selected capacitor in-circuit between the first lead 20 and the second lead 24. In one currently preferred embodiment, capacitor 93 has a rating of about 50 pF, capacitor 94 has a rating of about 350 pF, capacitor 95 has a rating of about 750 pF, capacitor 96 has a rating of about 1550 pF, and capacitor 97 has a rating of about 3150 pF. Therefore, the embodiment illustrated in FIG. 5 permits user selection of a capacitor having a rating of any of about 50 pF, 350 pF, 750 pF, 1550 pF, or 3150 pF. The capacitance value for any particular capacitor may be selected to provide a particular effective desired cut-off frequency, above which the signal between first lead 20 and second lead 24 will be attenuated. One position of illustrated switch 92 removes the low-pass filter from electrical communication in-circuit.

Certain embodiments of volume control circuitry may include a bass-boost circuit. One operable bass-boost circuit is indicated generally at 100 in FIG. 5. Bass-boost circuitry 100 includes a first capacitor 102 disposed in series between the first side 22 of the phase-inverter tube and the second end of the first lead 20. A second capacitor 104 is similarly disposed in series between the second side 26 of the phase-inverter tube and the second end of the second lead 24. Operable capacitors for a bass-boost circuit generally have a rating of less than about 0.05 µF. The bass-boost circuit can be placed into service, or removed from service, by an on/off switch. One operable such switch 105 (see FIG. 6) includes first and second switch elements 106, 108 disposed in parallel with, and operable to bypass, the respective first and second capacitors. When such switch is open, the signals carried by the first and second leads are attenuated by the respective first and second capacitors. When bass-boost circuit switch 105 is closed, the signals can effectively bypass the capacitors through the electrically conductive respective switch elements 106, 108. In a preferred constructions switch elements 106 and 108 may be configured as a 5 k pot, acting as a rheostat. This configuration renders the bass boost variable, instead of simply an ON of OFF switch.

Figure 6:
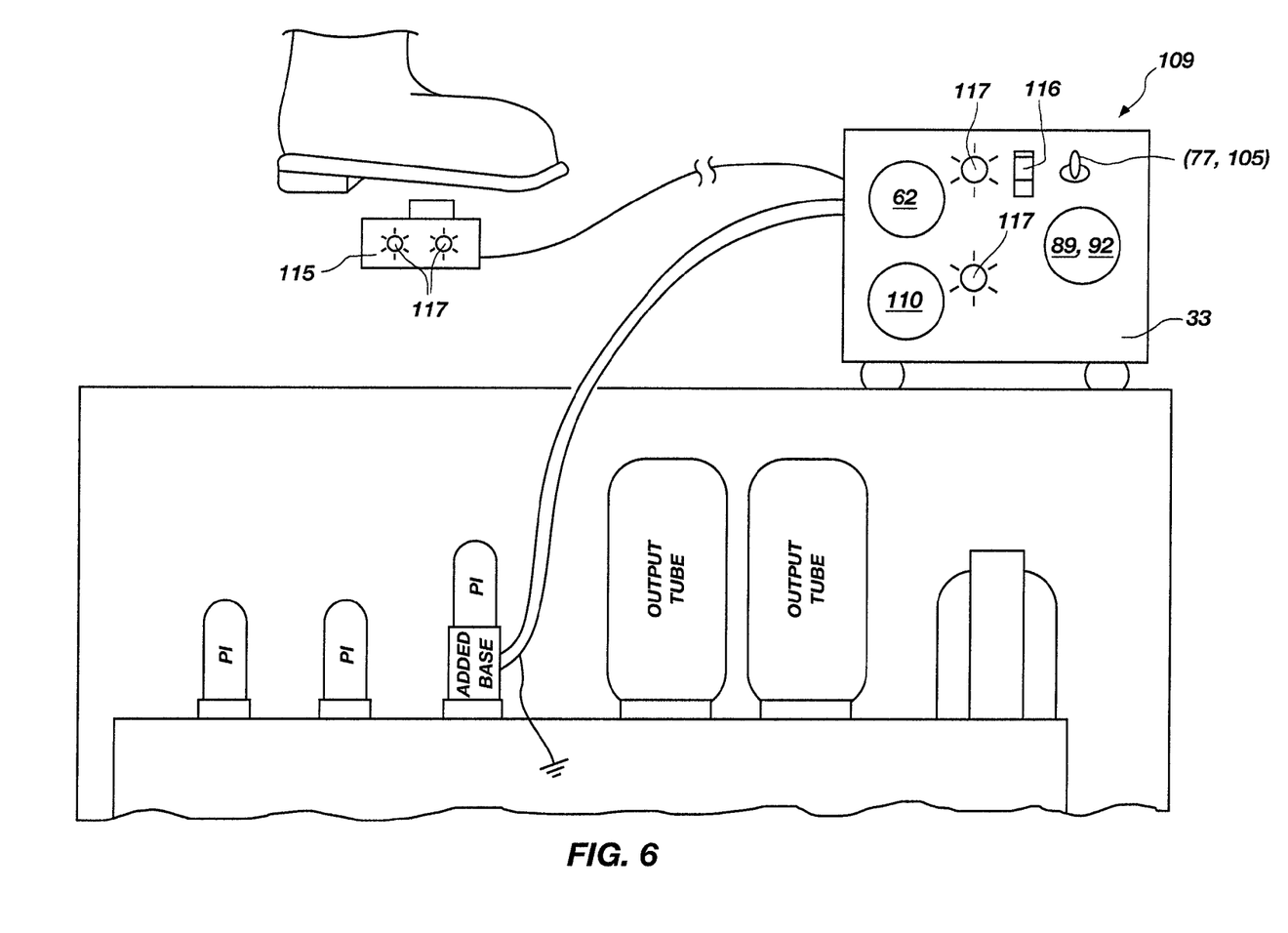
FIG. 6 is a pictorial view in elevation of a second embodiment structured according to certain principles of the invention.

With reference now to FIG. 6, certain embodiments of master volume control circuitry (e.g., dual-control unit indicated generally at 109), may include a plurality of volume controls to permit a user to effect rapid changes between fixed amplifier settings. Such fixed amplifier settings may be preselected according to a user's preference. Dual-control unit 109 includes both of a master volume control switch 62 and a second volume control switch 110. A second volume control switch 110 is generally structured similar to the master volume control switch, and may include a third rheostat connected in-circuit between the first lead 20 and ground, and a fourth rheostat connected in-circuit between the second lead 24 and ground. Again, the third and fourth rheostats are desirably ganged together to provide similar resistance changes responsive to user input.

Devices such as dual-control unit 109 having multi-level presets typically include a volume selector switch that is arranged to enable user selective operation of a particular volume control switch, or to enable a particular amplifier effect. For example, in use of dual-control unit 109, it is desirable to permit user selection, and consequential activation in-circuit, of either one of the master volume control switch 62 or the second volume control switch 110.

One currently preferred volume selector switch includes a foot-operated switch 115. Such foot-operated switch 115 can be placed in-circuit to energize one or more relay device effective to permit user-selectable electrical communication between either of: the first and second rheostat (e.g., master volume control switch 62) and the musical amplifier, or the third and fourth rheostat (e.g., second volume control switch 110) and the musical amplifier. In use, the user could adjust a plurality of volume controls to different desired respective settings, and operate switch 115 to change between such settings during a performance.

Power to operate volume-selector relay devices may be obtained from the phase-inverter tube filaments, and communicated to the remote enclosure 33 by way of an additional pair of electrically conductive power supply leads. Such additional power supply leads can be confined in, or associated with, the umbilical 46. Power to operate the relay devices is typically rectified to DC power using conventional circuitry. Rectification circuitry can be contained in the remote enclosure 33, or in the main enclosure 14.

When a volume selector switch, such as switch 115 or optional/alternative enclosure-mounted switch 116 is included, sometimes it is desirable to provide one or more light-emitting elements 117 disposed in-circuit and effective to indicate which volume control is currently active. DC power to drive one or more such indicator 117 can also be obtained from the aforementioned power supply leads.

In one embodiment of the dual control unit 109 each volume may be fitted with its own low-pass, its own bass-boost, and its own range switch. This arrangement provides the user with the ability of changing more that just volume with the 115 footswitch. This particular embodiment provides a completely double version of the single-volume embodiment.

Figure 7:
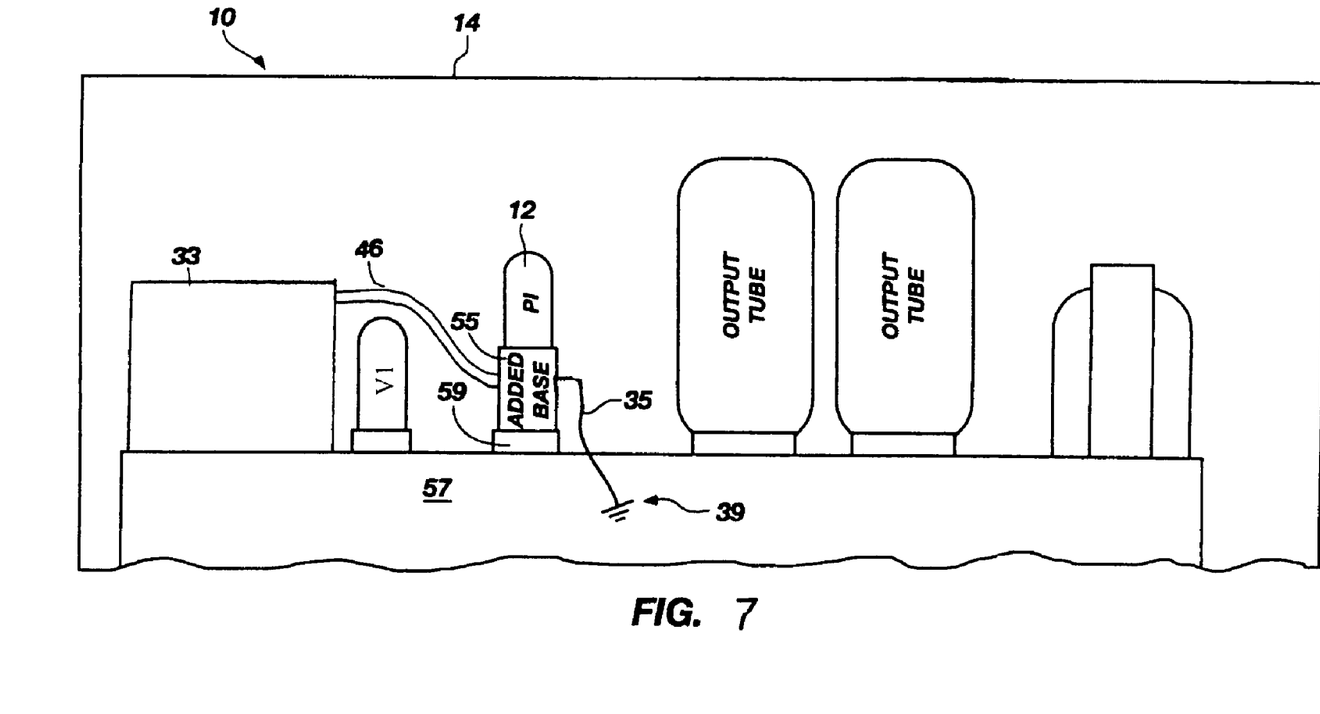
FIG. 7 is a pictorial view in elevation of a third embodiment structured according to certain principles of the invention.

A further embodiment of the invention is shown to advantage in FIG. 7, wherein the enclosure 33 and its associated componentry has been relocated from the location shown in FIG. 6 to a location within the enclosure 14. As shown the componentry of enclosure 33 is connected to the tube base 55 by means of umbilical 46.

Figure 8:
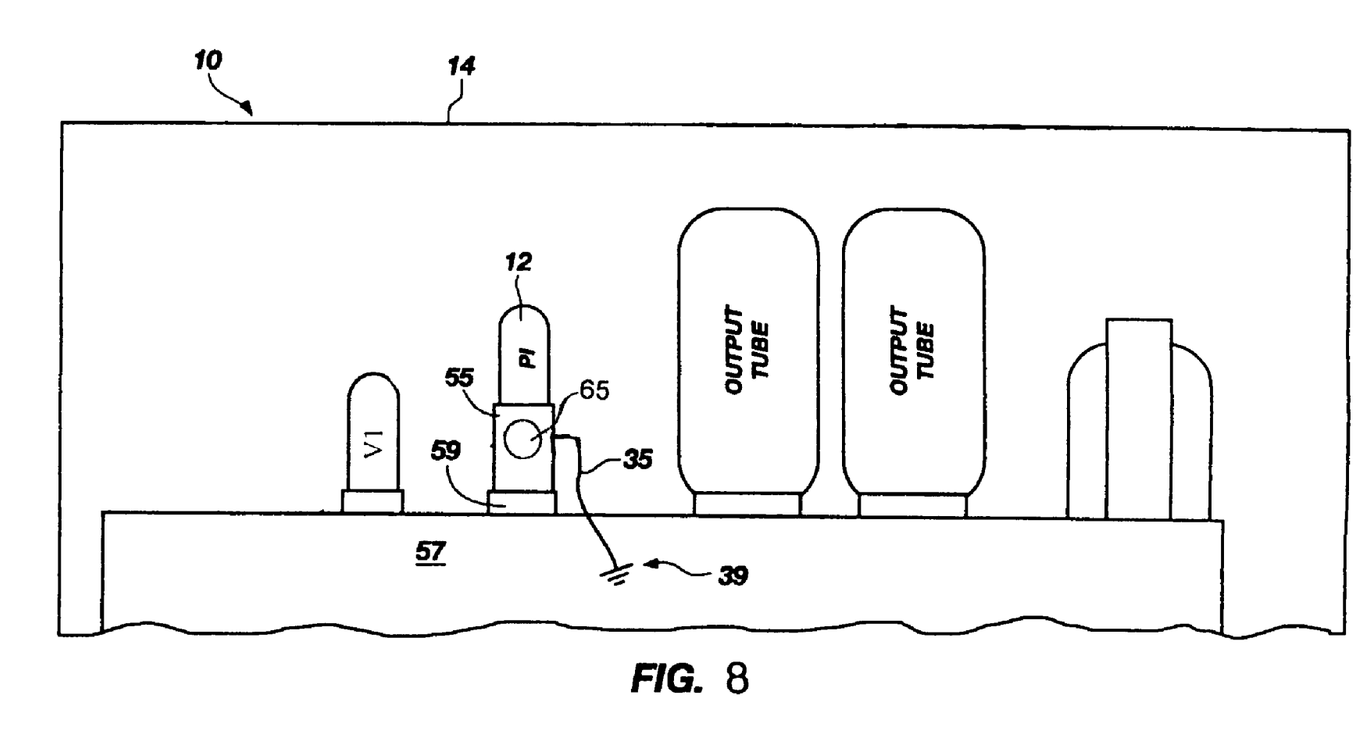
FIG. 8 is a pictorial view in elevation of a fourth embodiment structured according to certain principles of the invention.

FIG. 8 illustrates an alternative embodiment of the invention wherein the dual ganged volume pot 50,52 is mounted in the tube base 55. In this embodiment, a modification of the embodiment illustrated in FIG. 7, the enclosure 33, as well as the umbilical 46, would be eliminated from the structure. The ground 35 would continue to interconnect the tube base 55 and the chassis 39. A control knob 65 on the tube base operates to control the device.

A further embodiment of the invention includes the incorporation of the post phase-inverter master volume control in association with a conventional power attenuator. Currently, there are available on the market volume controls which are inserted between the amplifier's output and the speaker's input. Typically, these volume controls are enclosed in a separate enclosure. This separate enclosure is adapted with an input jack for receiving input from the amplifier as well as an output jack for transmitting an output to the speaker cabinet. Such conventional volume controls oftentimes include heat sinks as well as internal power resistors. Although such volume controls are intended to produce what is known in the art as an "on ten" sound, such volume controls have been found to alter the sound rather dramatically and oftentimes in a generally negative way. However, such conventional volume controls are effective in quieting a loud tube amplifier to manageable levels. A conventional volume control of this type, known as a THD HotPlate, is available from THD Electronics, Ltd. of Seattle, Wash. In this further embodiment, the instant post phase inverter master volume control is positioned intermediate the amplifier and the conventional power attenuator. In this arrangement, the power attenuator would operate to attenuate the volume after the post phase-inverter master volume control before the input signal are transmitted to the speaker. In this arrangement, the user would be able to obtain the benefits of the instant inventions well as the benefits of the power attenuator. The user would be able to use either the post phase-inverter master volume control or the conventional power attenuator or both of the two systems in tandem.

The present invention may be embodied in other specific forms without departing from its spirit or essential characteristics. The described embodiments are to be considered in all respects only as illustrative and not restrictive. The scope of the invention is, therefore, indicated by the appended claims, rather than by the foregoing description. All changes which come within the meaning and range of equivalency of the claims are to be embraced within their scope.

What is claimed is:

1. A post phase-inverter master volume control for use in combination with a tube-type musical amplifier having a phase-inverter tube disposed inside a main enclosure, the master volume control comprising:
   a first lead connected in-circuit at its first end with a signal at a first side of said phase-inverter tube, and a second lead connected in-circuit at its first end with the signal at a second side of said phase-inverter tube;
   a first rheostat connected in-circuit between a second end of said first lead and a first ground; and
   a second rheostat connected in-circuit between a second end of said second lead and a second ground.

2. The combination of claim 1 wherein said post phase-inverter master volume control is disposed within said main enclosure.

3. The combination of claim 1 wherein said first ground and said second ground are a common ground.

4. The combination of claim 1 wherein said post phase-inverter master volume control is disposed within a base of said phase-inverter tube.

5. A post phase-inverter master volume control for use in combination with a tube-type musical amplifier having a phase-inverter tube disposed inside a main enclosure, the master volume control comprising:
  a first lead connected in-circuit at its first end with a signal at a first side of said phase-inverter tube, and a second lead connected in-circuit at its first end with the signal at a second side of said phase-inverter tube;
  a third lead connected in-circuit at its first end with an amplifier ground;
  a first rheostat connected in-circuit between second ends of said third lead and said first lead; and
  a second rheostat connected in-circuit between second ends of said third lead and said second lead.

6. The combination according to claim 5, further comprising:
  a male/female tube base disposed between a circuit board of said amplifier and said phase-inverter tube, said tube base providing said first lead and said second lead.

7. The combination according to claim 6, wherein: said tube base comprises a 9-pin male/female tube base.

8. The combination of claim 5, further comprising:
  an external enclosure connected to said main enclosure by an umbilical comprising said first lead, said second lead, and said third lead, said external enclosure holding said first rheostat and said second rheostat; and
  a first DC blocking capacitor disposed in association with said first lead and a second DC blocking capacitor disposed in association with said second lead effective to resist conductance of DC voltages to said exterior enclosure.

9. The combination according to claim 5, wherein: said first rheostat and said second rheostat are comprised within a multi-gang rheostat.

10. The combination according to claim 5, further comprising:
  a range switching circuit, comprising an on/off switch disposed in electrical series with a resistor, disposed in-circuit between said first lead and said second lead.

11. The combination according to claim 10, wherein: said resistor has a resistance in excess of about 100 k ohms.

12. The combination according to claim 5, further comprising:
  a low-pass filter circuit disposed in-circuit between said first lead and said second lead.

13. The combination according to claim 12, wherein: said low-pass filter circuit comprises a capacitor and a resistor, said low-pass filter circuit being capable of adjustment by a user to change a value of the high-cut signal.

14. The combination according to claim 13, wherein: said low-pass filter circuit comprises a potentiometer and a capacitor connected in series between said first lead and said second lead.

15. The combination according to claim 14, wherein: said potentiometer comprises a 250 k ohm rating; and said capacitor has a rating of about 0.0047 micro Farads.

16. The combination according to claim 12, wherein: said low-pass filter circuit comprises a multi-position switch that is user operable to dispose a selected capacitor in-circuit between said first lead and said second lead.

17. The combination according to claim 16, wherein: said selected capacitor has a rating of about 50 pF, 350 pF, 750 pF, 1550 pF, or 3150 pF.

18. The combination according to claim 5, further comprising: a bass-boost circuit comprising:
  a first capacitor, having a rating of less than about 0.05 µF, disposed in series between said first side of said phase-inverter tube and said second end of said first lead;
  a second capacitor, having a rating of less than about 0.05 µF, disposed in series between said second side of said phase-inverter tube and said second end of said second lead;
  a first switch element disposed in parallel with, and operable to bypass, said first capacitor; and
  a second switch element disposed in parallel with, and operable to bypass, said second capacitor.

19. The combination according to claim 5, further comprising:
  a second volume control, comprising:
    a third rheostat connected in-circuit between said third lead and said first lead;
    a fourth rheostat connected in-circuit between said third lead and said second lead; and
    a volume selector switch arranged to enable operation of one of said master volume control and said second volume control.

20. The combination according to claim 19, wherein: said volume selector switch comprises a foot-operated switch.

21. The combination according to claim 20, further comprising:
  a relay arranged in-circuit for actuation by said foot-operated switch effective to permit user selectable electrical communication between either of said first rheostat or said third rheostat, and said musical amplifier.

22. The combination according to claim 21, further comprising:
  a light-emitting element disposed in-circuit effective to indicate a currently active volume control.

23. The combination according to claim 5 wherein said post phase-inverter master volume control is disposed within said main enclosure.

24. A post phase-inverter master volume regulator for use in combination with a tube-type musical amplifier having a phase-inverter tube disposed inside a main enclosure, the master volume regulator comprising:
  a switch enclosure connected to said main enclosure by an umbilical comprising a first lead, a second lead, and a third lead, said switch enclosure holding a first rheostat and a second rheostat that operate as a user adjustable master volume control;
  a male/female tube base disposed between the phase-inverter tube socket of said amplifier and said phase-inverter tube, said tube base providing said first lead and said second lead; wherein:
    said first lead communicates the signal from a first side of the DC plate voltage supply for said phase-inverter tube to a signal input associated with said first rheostat;
    said second lead communicates the signal from a second side of the DC plate voltage supply for said phase-inverter tube to a signal input associated with said second rheostat; and
    said third lead communicates an amplifier ground to a signal output associated with each of said first rheostat and said second rheostat.

25. The regulator according to claim 24, further comprising:
  a first DC blocking capacitor disposed in association with said first lead and a second DC blocking capacitor disposed in association with said second lead effective to resist conductance of dangerous DC voltages to said switch enclosure;

a bass-boost circuit, disposed inside said switch enclosure, user operable to emphasize low frequency signals transmitted through said first and second leads; and a high-cut control circuit, disposed inside said switch enclosure, user operable to change attenuation of high frequency signals transmitted through said first and second leads.

26. The regulator according to claim 24, further comprising:

a second volume control comprising a third rheostat and a fourth rheostat, both such rheostats being arranged to provide a variable resistance in-circuit between a signal input and ground;

first switch structure adapted to permit selective communication of the signal carried by said first lead to a signal input associated with either of said first rheostat and said third rheostat;

second switch structure that permit selective communication of the signal carried by said second lead to a signal input associated with either of said second rheostat and said fourth rheostat; and a foot-operated volume selector switch disposed in-circuit operably to actuate said first switch structure and said second switch structure effective to activate either of said master volume control and said second volume control.

* * * * *